United States Patent [19]

Chapman

[11] Patent Number: 4,977,993

[45] Date of Patent: Dec. 18, 1990

[54] OUT-OF-TUBE INSPECTION PART HOLDER

[75] Inventor: Gregory M. Chapman, Meridian, Id.

[73] Assignee: Micron Technology, Inc., Boise, Id.

[21] Appl. No.: 350,775

[22] Filed: May 12, 1989

[51] Int. Cl.⁵ .............................................. B65G 47/24
[52] U.S. Cl. .................................. 193/45; 198/346.2; 198/409; 193/47
[58] Field of Search ........................ 193/44, 45, 47; 198/346.2, 408, 409; 209/542, 545; 414/764, 765, 771, 773, 784, 778, 783, 758

[56] References Cited

U.S. PATENT DOCUMENTS 2,881,899  4/1959  Rasmussen ............... 414/773 X
3,386,598  6/1968  Ferko ............................ 414/771

FOREIGN PATENT DOCUMENTS 1303647  4/1973  Fed. Rep. of Germany ...... 414/771
0144598  10/1980  Fed. Rep. of Germany ........ 193/45

OTHER PUBLICATIONS

Naylor et al.; "Western Electric Technical Digest"; vol. 48, 10/1977, pp. 21 and 22.

Primary Examiner—D. Glenn Dayoan
Attorney, Agent, or Firm—Hopkins, French, Crockett, Springer and Hoopes

[57] ABSTRACT

Apparatus for holding integrated circuit parts for inspection for cracks, holes, or other defects. The apparatus permits inspection of the top, bottom and both sides without need for the inspector to change position. The parts are slidably retained within the apparatus between upper and lower tracks. The upper and lower tracks pivot relative to one another, and relative to a base member, about a common pivot point.

10 Claims, 3 Drawing Sheets

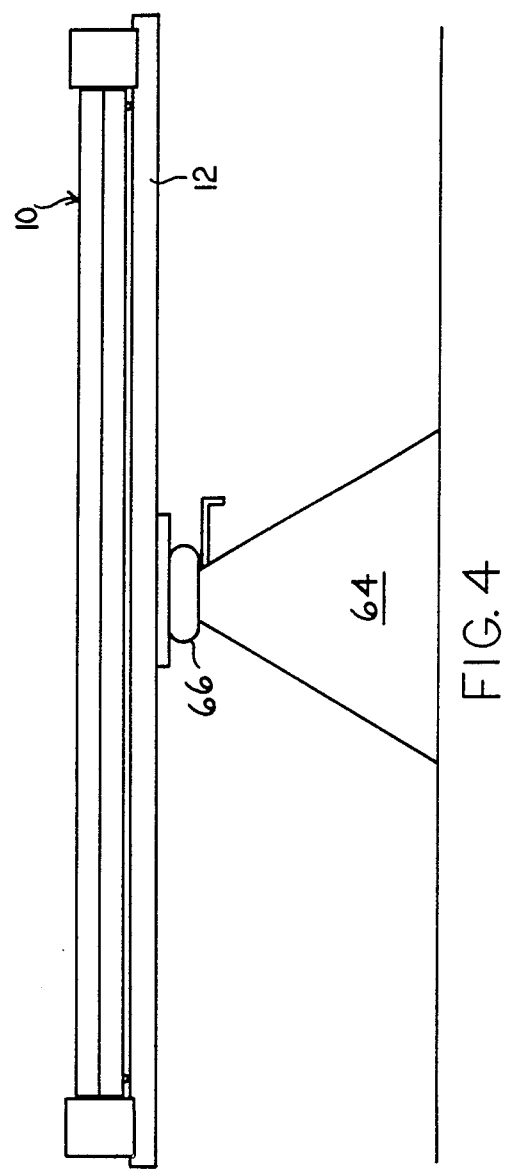

4,977,993

OUT-OF-TUBE INSPECTION PART HOLDER

BACKGROUND OF THE INVENTION

This invention relates to an apparatus enabling the inspection of integrated circuit parts without inflicting damage thereto.

The manufacture of memory devices containing integrated circuits, while highly automated, requires numerous inspections which can only be performed by hand. Thus far, automated inspection techniques are not available to detect all possible defects which are visually apparent to human inspectors. Integrated circuits are typically packaged in plastic or ceramic "packages" which surround the silicon chip holding the circuitry, as well as the soldered interconnection between the circuitry and lead wires.

After formation of the "package" or "part", and after sufficient curing time for the ceramic or plastic package, the parts must be inspected for cracks or holes in the package, condition of the solder on the leads, or for bent, short or otherwise deformed lead wires. Heretofore, such inspection could only be accomplished by placing a quantity of the parts on an inspection surface (such as a table top), and manually inspecting each part individually. Not only is this time consuming in terms of collecting the parts for insertion into a transport tube, but there was no way to easily and conveniently compare a plurality of parts one to the other, such as for length of the lead wires.

Alternatively, Applicant has inspected parts by sliding them down a track simulating the shape of the clear plastic transport tubes well known in the industry. However, inspection on such tracks is inadequate since only one side of the part can be inspected, and there are no retaining means to ensure that the parts do not fall off the track, potentially causing either physical damage to the package or leads, or electrical damage to the internal circuitry. Applicant is unaware of any inspection device which permits rapid and consistent inspection of integrated circuit parts, while ensuring that minimal damage is done to the parts by the inspection procedure.

Therefore, it is an object of the present invention to provide an apparatus which enables a human inspector to visually inspect integrated circuit parts for external damage or inconsistencies in either the package or the lead wires.

Further, it is an object of the present invention to provide a device which permits a plurality of such parts to be inspected simultaneously so as to compare one against the others, and to inspect both the top, bottom and sides easily and quickly.

SUMMARY OF THE INVENTION

The present invention comprises an apparatus adapted to interfit with clear plastic inspection tubes or other inspection/transport devices, used to inspect and transport integrated circuit parts. When a plurality of integrated circuit parts are transferred from the inspection tube to the device of the present invention, they are maintained in an end-to-end relationship within the device permitting the parts to be compared against one another for defects. The device comprises a base member which can be adapted to either sit upon, for instance, an inspection table, or can be arranged in a "teeter-totter" configuration. In either case, it is desirable that the base member be movable so that both sides of the parts contained therein can be observed by an inspector. The base member comprises a lower and upper track which pivot relative to one another about a common pivot point. The lower track is provided with a rail which interfits into the plastic transport tube to accept the parts into the inspection device. A first stop member can be affixed to one of the upper or lower tracks and adjusted to provide a gap between the upper and lower tracks such that the parts may slide therebetween, but be prevented from falling off the rail. The upper and lower tracks also rotate together approximately 180° about the common pivot point relative to the base member, from a first inspection position to a second inspection position. In the second inspection position, the lower track is on top and the upper track is on bottom, thereby inverting the integrated circuit part. A second stop member prevents rotation of the upper and lower tracks about the pivot point beyond about 180° from its position in the first inspection position. A third stop member can be provided in ensure that the upper and lower track members are uniformly aligned relative to the base member.

When in the first inspection position, the upper track may be rotated away from the lower track so as to view the top of the parts, and when in the second inspection position, the lower track may be rotated away from the upper track to permit inspection of the bottom of the part. In either or both of the first or second inspection positions, the sides, and the lead wires, may be inspected. The holder should preferably be constructed of electrically conductive materials, and grounded to prevent electrical damage to the integrated circuit electrical components.

BRIEF DESCRIPTION OF THE DRAWINGS

FIG. 4 is a schematic view of an alternative embodiment of the present invention.

DETAILED DESCRIPTION OF THE INVENTION

At the outset it should be understood that, while this device will be described and illustrated when using a dual-in-line part (DIP), it is equally susceptible, with minor modifications, for inspection of almost any configuration of integrated circuit package. In its broadest embodiment, the apparatus of the present invention is not limited to the inspection of any particular part geometry, but rather can be adapted for use with any part without undue experimentation.

Figure 1:
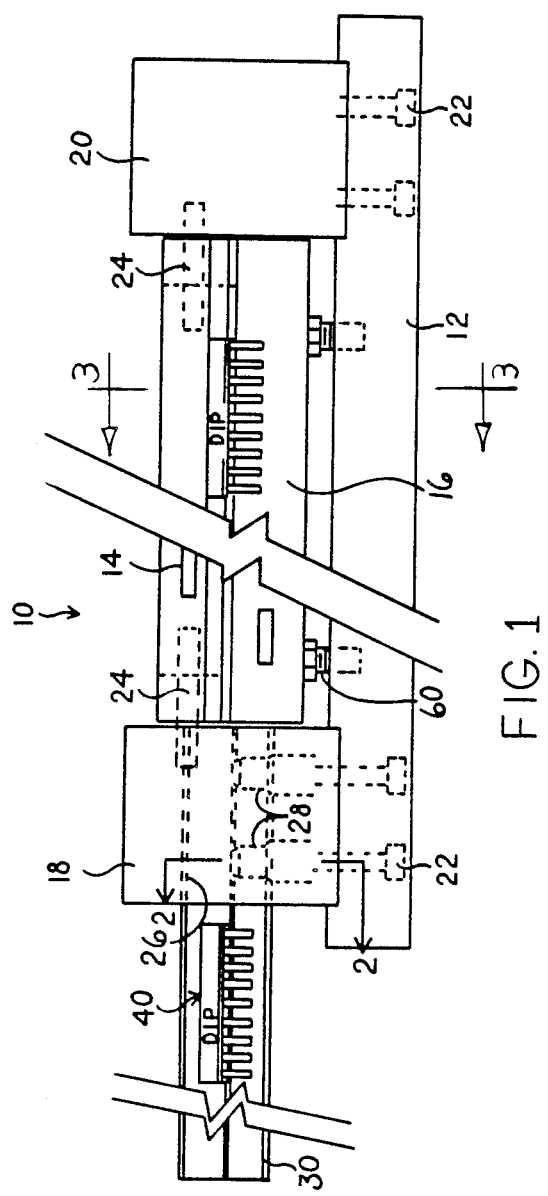
FIG. 1 is a side view of the apparatus of the present invention.

As illustrated in FIG. 1, the out-of-tube inspection part holder 10 comprises a base member 12, an upper track 14 and a lower track 16 arranged to slidably clamp, or retain a plurality of integrated circuit parts therebetween. An onload end piece 18 and track support 20 are affixed to the base member 12, as by bolts 22. A pair of pivot pins 24 suspend the upper and lower tracks from the end piece 18 and track support 20. The pivot pins 24 define the axis of rotation of both (i) rotation of the upper and lower tracks relative to one another, and (ii) rotation of the upper and lower tracks relative to the base member 12. It is critical that the apparatus of the present invention provide easy access for inspection of the bottom of the apparatus. The unique design of the present invention provides such access without losing control of the integrated circuit part.

Figure 2:
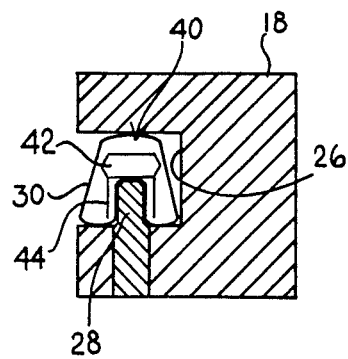
FIG. 2 is a sectional view taken along lines 2—2 of FIG. 1.

The onload end piece 18 is provided with an aperture 26 within which are provided at least two guide pins 28. As illustrated in FIG. 2, an inspection/transport tube 30 is provided in a generally inverted-U-shape with a plurality of integrated circuit parts 40 contained therein. The parts 40 generally comprise a plastic or ceramic package 42, and a plurality of leads 44 depending therefrom on each side of the package. Therefore, the parts 40 are retained within the tube 30 and are enabled to slide within the tube while maintaining the proper orientation. The diameter of the guide pins 28 is slightly larger than the space between the legs of the tube 30 so that tube 30 can be guided by frictional engagement with the pins 28. Generally speaking, approximately twenty-five of the parts 40 are retained within the tube 30 for transport or inspection.

Figure 3:
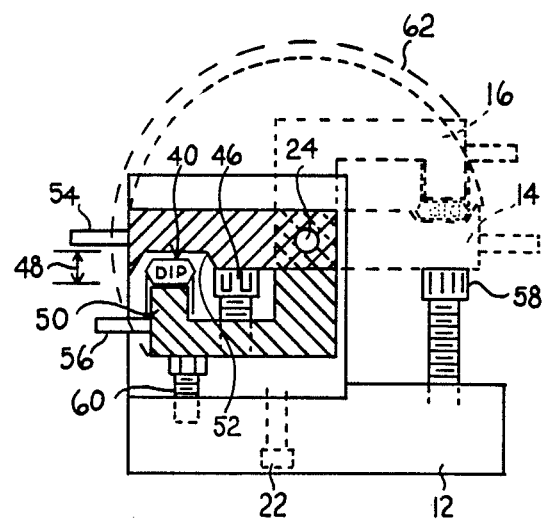
FIG. 3 is a sectional view of the apparatus taken along lines 3—3 of FIG. 1.

Referring now to FIG. 3, the upper and lower tracks 14, 16, respectively, are illustrated in a first inspection position (solid lines) and a second inspection position (broken lines). The upper and lower tracks are pivotable about the pivot pin 24 relative to one another and relative to the base 12. A first stop member 46 is provided to regulate the closure of the upper and lower tracks relative to one another. As illustrated, the first stop member 46 is a pin affixed to the lower track 16; it could as easily be affixed to the upper track 14. The first stop member is preferably threadably engaged with one of the tracks 14, 16 so that by threading the stop member 46 in or out, the gap 48 between the upper and lower tracks can be increased or decreased depending on the size of the parts to be inspected. As illustrated, the lower track 16 is provided with a rail 50 upon which the parts 40 are retained after leaving the tube 30. The upper track 14 is provided with a slot 52 within which the part 40 is retained. Handles 54, 56 may be provided on each of the upper and lower tracks for ease of movement.

A second stop member 58 is provided on the base member 12 in order to regulate the amount of rotation of the upper track 14 about pivot pin 24. The second stop member 58 is preferably an adjustable screw or pin threadably engaged with the base 12, thereby permitting adjustment of the member 58. Likewise, a third stop member 60 is threadably engaged with the base member 12 so as to regulate the position of the lower track 16 relative to the base member. When in the first inspection position (solid lines of FIG. 3), the stop member 60 determines the relative position of the upper and lower tracks 14, 16. When in the second inspection position (broken lines of FIG. 3), the stop member 58 determines the relative position of upper and lower tracks 14, 16. The upper and lower tracks are pivotable about the pivot pin 24 from the first inspection position to the second inspection position about arc 62.

It can be seen that when the tube 30 is inserted into the aperture 26 of end piece 18, the guide pins 28 will guide the tube 30 to the rail 50 of lower track 16. By tilting the holder such that the holder is below the tube, the parts 40 will be gravity fed onto the rail 50. The gap 48 between the upper and lower tracks must be sufficient to enable the tube 30 to slide therebetween for the deposit of the parts onto rail 50. After being fed onto the rail 50, the upper track 14 may be pivoted away from the lower track so that the tops of the parts 40 may be inspected. After pivoting the upper and lower tracks to the second inspection position of FIG. 3, the lower track 16 may be pivoted away from the upper track so as to inspect the bottoms of the parts 40. In either of the first or second inspection positions, the lead wires 44 may be inspected by comparing adjacent parts one to another. In a preferred embodiment, the upper and lower tracks are provided in different colors so that the package 42 and leads 44 of the part 40 may be compared against different and contrasting backgrounds.

As illustrated schematically in FIG. 4, another embodiment of the present invention comprises the holder 10 affixed to a secondary base 64. A joint 66 permitting at least two-way movement of the holder interconnects the base member 12 with the secondary base 64. For instance, a ball joint could be utilized to permit rotation of the holder 10 in a teeter-totter-like manner to on-load and off-load parts 40 out of and returning into the tube 30. Likewise, such a joint would permit the entire holder to be rotated 180° in a plane parallel to the work surface 68 so that both sides of the part 40 may be viewed without the inspector having to leave his station.

Preferably, the apparatus of the present invention is grounded so as to eliminate any electrical damage (static or otherwise) to the parts being inspected. The parts are preferably manufactured from a conductive material, such as aluminum or carbon.

Use of the present invention eliminates handling of the parts and thereby reduces risk of electrical damage to the internal components. Only a part with an apparent defect need be handled. The speed and accuracy with which parts can be inspected for hairline cracks, pin holes, solder defects, size defects, etc., is greatly enhanced because with the proximity and uniformity of which the parts can be compared against one another. Additionally, the present invention enables an inspector to inspect the top, bottom and both sides of a part without the need to stand or otherwise leave his inspection station.

While a preferred embodiment of the invention has been disclosed, various modes of carrying out the principles disclosed herein are contemplated as being within the scope of the following claims. Therefore, it is understood that the scope of the invention is not to be limited except as otherwise set forth in the claims.

I claim:

1. An out-of-tube inspection part holder, comprising:
   a. an elongate base member
   b. a lower track having a rail for carrying a plurality of parts for inspection in a first inspection position;
   c. an upper track pivoted about a pivot point relative to the lower track to maintain a plurality of parts between the upper and lower tracks;
   d. a first stop member preventing closure of the upper and lower tracks to maintain a gap therebetween;
   e. the upper and lower tracks being rotated relative to the base member about the pivot point such that the upper and lower tracks may each be pivoted about 180° to a second inspection position; and
   f. a second stop member preventing rotation of the upper and lower tracks past the second inspection position.

2. The holder of claim 1, wherein a third stop member is provided on the base member to ensure the lower track is aligned generally perpendicular to the base member.

3. The holder of claim 1, wherein the pivot point is a common pivot point for the pivoting of the upper and lower tracks relative to one another, and for the pivoting of the upper and lower tracks relative to the base member.

4. The holder of claim 1, wherein when the upper and lower tracks are each rotated 180° to the second inspection position, the lower track may thereafter be pivoted about the pivot point back to the first inspection position.

5. The holder of claim 4, wherein each of the upper and lower tracks is provided with a handle to facilitate rotation about the pivot point.

6. The holder of claim 1, wherein the part comprises a dual-in-line package having lead wires depending on either side of the rail.

7. The holder of claim 6, wherein the parts are temporarily stored in an elongate storage container with the parts aligned end-to-end, the storage container adapted to fit within the gap between the upper and lower tracks.

8. The holder of claim 1, wherein the holder is manufactured of electrically conductive materials.

9. The holder of claim 8, wherein the upper and lower tracks are manufactured in contrasting colors so that the various portions of the part can be observed against different colored backgrounds.

10. The holder of claim 1, wherein the holder is grounded to eliminate transmittance of electrical charges into the part.

* * * * *